(12) United States Patent
Zhang et al.

(10) Patent No.: US 10,644,041 B1
(45) Date of Patent: May 5, 2020

(54) ARRAY SUBSTRATE, METHOD FOR MAKING THE ARRAY SUBSTRATE, AND DISPLAY APPARATUS

(71) Applicants: ORDOS YUANSHENG OPTOELECTRONICS CO., LTD., Ordos, Inner Mongolia (CN); BOE TECHNOLOGY GROUP CO., LTD., Beijing (CN)

(72) Inventors: Yongqiang Zhang, Beijing (CN); Jun Fan, Beijing (CN)

(73) Assignees: ORDOS YUANSHENG OPTOELECTRONICS CO., LTD., Ordos, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/403,706

(22) Filed: May 6, 2019

(30) Foreign Application Priority Data

Nov. 1, 2018 (CN) .......................... 2018 1 1294729

(51) Int. Cl.
*H01L 27/12* (2006.01)
*G06F 3/047* (2006.01)
(Continued)

(52) U.S. Cl.
CPC .......... *H01L 27/127* (2013.01); *H01L 27/124* (2013.01); *H01L 27/1225* (2013.01);
(Continued)

(58) Field of Classification Search
CPC ... G02F 2001/133388; G02F 1/134318; G02F 2001/136295; H01L 29/42372; H01L 27/124; H01L 27/1251
See application file for complete search history.

(56) References Cited

U.S. PATENT DOCUMENTS

2004/0096999 A1\* 5/2004 Lin ...................... H01L 27/1214
438/30
2015/0129870 A1\* 5/2015 Hsin .................. H01L 29/78618
257/43
(Continued)

FOREIGN PATENT DOCUMENTS

CN 107403804 A 11/2017
CN 108122928 A 6/2018
(Continued)

OTHER PUBLICATIONS

First Office Action for CN Appl. No. 201811294729.9, dated Mar. 5, 2020.

*Primary Examiner* — George R Fourson, III
(74) *Attorney, Agent, or Firm* — Foley & Lardner LLP

(57) ABSTRACT

This disclosure discloses an array substrate, a method for making the same, and a display apparatus. The array substrate comprises a display area and a peripheral area around the display area. The method comprises: forming an active layer of a low temperature polysilicon TFT in the peripheral area of the array substrate; forming a gate of a oxide TFT disposed in the same layer as a source and a drain of the low temperature polysilicon TFT in the display area of the array substrate, and forming an active layer of the oxide TFT electrically insulated from the gate of the oxide TFT above the gate of the oxide TFT; forming a source and a drain of the oxide TFT on the active layer of the oxide TFT.

20 Claims, 6 Drawing Sheets

(51) Int. Cl.
 *G02F 1/1333* (2006.01)
 *H01L 29/423* (2006.01)
 *G02F 1/1362* (2006.01)

(52) U.S. Cl.
 CPC ............ *G02F 2001/133388* (2013.01); *G02F 2001/136295* (2013.01); *G06F 3/047* (2013.01); *H01L 27/1251* (2013.01); *H01L 29/42372* (2013.01)

(56) References Cited

U.S. PATENT DOCUMENTS

| | | | |
|---|---|---|---|
| 2016/0329352 A1* | 11/2016 | Lv | H01L 21/77 |
| 2016/0343737 A1* | 11/2016 | Zhang | H01L 27/1225 |
| 2017/0278916 A1* | 9/2017 | Maruyama | H01L 27/3276 |
| 2018/0033849 A1* | 2/2018 | Noh | H01L 27/3272 |
| 2019/0279559 A1* | 9/2019 | Lin | G09G 3/32 |

FOREIGN PATENT DOCUMENTS

| | | |
|---|---|---|
| CN | 108231795 A | 6/2018 |
| JP | 2004-356371 A | 12/2004 |

\* cited by examiner

ARRAY SUBSTRATE, METHOD FOR MAKING THE ARRAY SUBSTRATE, AND DISPLAY APPARATUS

CROSS-REFERENCE TO RELATED APPLICATIONS

This application claims priority to Chinese Patent Application 201811294729.9, filed on Nov. 1, 2018.

TECHNICAL FIELD

This disclosure relates to an array substrate, a method for making the array substrate, and a display apparatus.

BACKGROUND

In the field of display technologies, a thin film transistor liquid crystal display (TFT-LCD) has advantages such as light weight, thin profile, low power consumption, high brightness, and high image quality, which occupies an important status in the field of flat-panel display. In particular, a flat-panel display apparatus with large size, high resolution, and high image quality, such as a liquid crystal television, has dominated the current flat-panel display market.

With the development of the TFT-LCD technology, people's requirements for the low power consumption performance of display apparatuses become higher and higher. Therefore, there exists a need for an improved TFT-LCD.

SUMMARY

In view of the above, embodiments of this disclosure provide an array substrate and a method for making the array substrate, and a display apparatus.

According to an aspect of the present disclosure, there is provided a method for fabricating an array substrate comprising a display area and a peripheral area around the display area, the method comprising: forming an active layer of a low temperature polysilicon thin film transistor (TFT) in the peripheral area, forming a gate of the low temperature polysilicon TFT above the active layer of the low temperature polysilicon TFT, and forming a source and a drain of the low temperature polysilicon TFT electrically connected to the active layer of the low temperature polysilicon TFT; forming a gate of an oxide TFT disposed in the same layer as the source and the drain of the low temperature polysilicon TFT in the display area, and forming an active layer of the oxide TFT electrically insulated from the gate of the oxide TFT above the gate of the oxide TFT; forming a source and a drain of the oxide TFT on the active layer of the oxide TFT by using wet etching.

In an example, forming the gate of the low temperature polysilicon TFT above the active layer of the low temperature polysilicon TFT, and forming the source and the drain of the low temperature polysilicon TFT electrically connected to the active layer of the low temperature polysilicon TFT comprises: forming a first insulation layer on the active layer of the low temperature polysilicon TFT, forming a gate metal layer on the first insulation layer, and patterning the gate metal layer in the peripheral area to form the gate of the low temperature polysilicon TFT; forming an interlayer dielectric layer on the gate metal layer, forming a first metal layer on the interlayer dielectric layer, and patterning the first metal layer in the peripheral area to form the source and the drain of the low temperature polysilicon TFT; wherein the source and the drain of the low temperature polysilicon TFT are electrically connected to the active layer of the low temperature polysilicon TFT through vias.

In an example, the method for fabricating the array substrate further comprises: while forming the source and the drain of the low temperature polysilicon TFT electrically connected to the active layer of the low temperature polysilicon TFT, forming a source wiring of the oxide TFT disposed in the same layer as the source and the drain of the low temperature polysilicon TFT in the display area, the source wiring of the oxide TFT being electrically connected to the source of the oxide TFT positioned above the source wiring through a via.

In an example, the method for fabricating the array substrate further comprises: while forming the gate of the low temperature polysilicon TFT above the active layer of the low temperature polysilicon TFT, forming a gate wiring of the oxide TFT disposed in the same layer as the gate of the low temperature polysilicon TFT in the display area, wherein the gate wiring of the oxide TFT is connected to the gate of the oxide TFT through a via in the interlayer dielectric layer.

In an example, forming the source wiring of the oxide TFT disposed in the same layer as the source and the drain of the low temperature polysilicon TFT in the display area comprises: patterning the first metal layer in the display area to form the source wiring of the oxide TFT; while patterning the first metal layer, forming the source wiring of the oxide TFT and the source and the drain of the low temperature polysilicon TFT using a single patterning process.

In an example, forming the gate of the oxide TFT disposed in the same layer as the source and the drain of the low temperature polysilicon TFT in the display area comprises: while patterning the first metal layer, forming the source wiring of the oxide TFT, the source and the drain of the low temperature polysilicon TFT, and the gate of the oxide TFT using a same patterning process.

In an example, the method for fabricating the array substrate further comprises: forming the active layer of the oxide TFT electrically insulated from the gate of the oxide TFT above the gate of the oxide TFT comprises: forming a second insulation layer on the source wiring of the oxide TFT and the gate of the oxide TFT and depositing the active layer of the oxide TFT on the second insulation layer in the display area, wherein a material of the active layer of the oxide TFT comprises a metal oxide or a metal oxynitride.

In an example, the method for fabricating the array substrate further comprises: forming the source and the drain of the oxide TFT on the active layer of the oxide TFT by using wet etching comprises: forming a second metal layer on the second insulation layer in the display area, patterning the second metal layer by using wet etching to form the source and the drain of the oxide TFT, wherein the source and the drain of the oxide TFT cover the ends of the active layer of the oxide TFT, and wherein the source of the oxide TFT is connected to the source wiring of the oxide TFT through a via in the second insulation layer.

In an example, the method for fabricating the array substrate further comprises: forming a first protection layer, a first planarization layer, a common electrode of the oxide TFT, a second protection layer, and a pixel electrode of the oxide TFT on the source and the drain of the oxide TFT in this order, wherein the pixel electrode is electrically connected to the drain of the oxide TFT.

In an example, the method for fabricating the array substrate further comprises: after forming the first metal layer and before forming the second insulation layer, forming a touch wiring of the oxide TFT on the interlayer dielectric layer in the display area, wherein the touch wiring of the oxide TFT is electrically connected to the common electrode of the oxide TFT.

In an example, the method for fabricating the array substrate further comprises: after forming the first planarization layer and before forming the second protection layer, forming a third protection layer, a touch wiring of the oxide TFT, and a second planarization layer on the first planarization layer in the display area in this order, wherein the touch wiring of the oxide TFT is electrically connected to the common electrode.

According to another aspect of the present disclosure, there is provided an array substrate, comprising: at least one low temperature polysilicon (thin film transistor) TFT in a peripheral area of the array substrate, the low temperature polysilicon TFT comprising: an active layer of the low temperature polysilicon TFT, a gate of the low temperature polysilicon TFT formed above the active layer of the low temperature polysilicon TFT, and a source and a drain of the low temperature polysilicon TFT electrically connected to the active layer of the low temperature polysilicon TFT; and at least one oxide TFT in a display area of the array substrate, the oxide TFT comprising: a gate of the oxide TFT disposed in the same layer as the source and the drain of the low temperature polysilicon TFT, an active layer of the oxide TFT electrically insulated from and above the gate of the oxide TFT, and a source and a drain of the oxide TFT formed on the active layer of the oxide TFT by using wet etching.

In an example, the array substrate further comprises a source wiring of the oxide TFT, wherein the source wiring of the oxide TFT is electrically connected to the source of the oxide TFT through a via.

In an example, the array substrate further comprises a gate wiring of the oxide TFT, wherein the gate wiring of the oxide TFT is electrically connected to the gate of the oxide TFT through a via.

In an example, the array substrate further comprises a first protection layer, a first planarization layer, a common electrode of the oxide TFT, a second protection layer, and a pixel electrode of the oxide TFT in the display area formed above the source and the drain of the oxide TFT in this order, wherein the pixel electrode is electrically connected to the drain of the oxide TFT.

In an example, the array substrate further comprises a touch wiring of the oxide TFT in the display area, wherein the touch wiring of the oxide TFT is electrically connected to the common electrode of the oxide TFT.

In an example, the array substrate further comprises a first protection layer, a first planarization layer, a third protection layer, a touch wiring of the oxide TFT, a second planarization, a common electrode of the oxide TFT, a second protection layer, and a pixel electrode of the oxide TFT in the display area formed above the source and the drain of the oxide TFT in this order, wherein the common electrode of the oxide TFT is electrically connected to the touch wiring of the oxide TFT, and wherein the pixel electrode is electrically connected to the drain of the oxide TFT.

In an example, the active layer of the low temperature polysilicon TFT comprises a polysilicon, and wherein the active layer of the oxide TFT comprises a metal oxide or a metal oxynitride.

According to yet another aspect of the present disclosure, there is provided a display apparatus comprising the array substrate as stated above.

In an example, the active layer of the low temperature polysilicon TFT comprises a polysilicon, and wherein the active layer of the oxide TFT comprises a metal oxide or a metal oxynitride.

DETAILED DESCRIPTION

Figure 1:
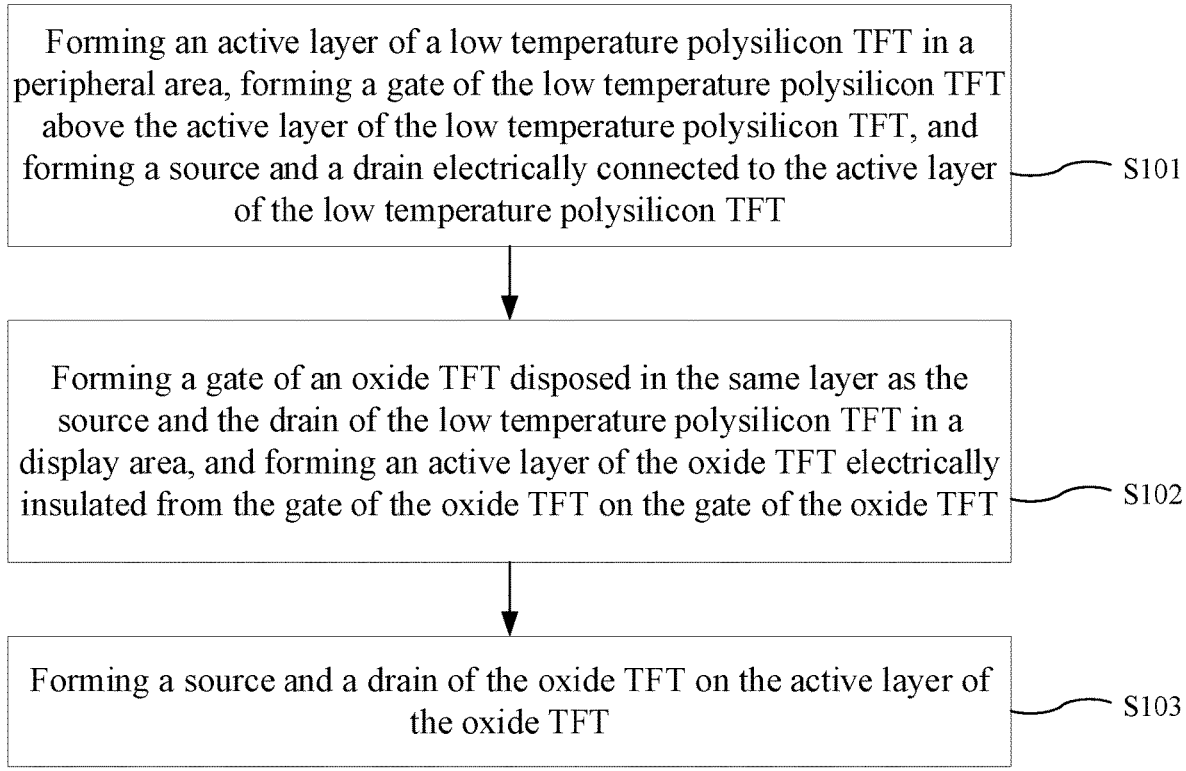
FIG. 1 is a schematic flowchart of a method for fabricating an array substrate provided by the embodiments of this disclosure.

Specific implementations of a method for fabricating a thin film transistor, the thin film transistor, an array substrate, and a display apparatus provided by embodiments of this disclosure will be illustrated in detail below in connection with the drawings.

The thickness and the shape of each film layer in the drawings do not reflect the true scale of the array substrate, which is only intended to schematically illustrate the content of this disclosure.

In the field of thin film transistor liquid crystal displays, achieving a LTPS (low temperature polysilicon) display technology with lower energy consumption is becoming more and more popular. Compared to a polysilicon display technology, LTPS has larger electron mobility. However, it has a problem of large leakage current. Therefore, an oxide thin film transistor (TFT) which replaces the polysilicon with an oxide as an active layer is widely used in liquid crystal displays due to its large on-state current, high mobility, good uniformity, high transparency, and simple fabrication process.

Although the leakage current in the oxide thin film transistor is normally small, which enables reduced pixel refresh rate and thereby lower power consumption, source and drain metal layers are mainly fabricated by dry etching in the LTPS process, which will damage the active layer of the oxide TFT during fabricating, thereby leading to oxide TFTs with poor performance.

Therefore, how to reduce the damage to the active layer of the oxide TFT is a technical problem to be solved for those skilled in the art.

Referring to FIG. 1, FIGS. 2a to 2e, and FIGS. 4a to 4f, an embodiment of this disclosure provides a method for fabricating an array substrate, wherein the array substrate comprises a display area and a peripheral area around the display area. The method for fabricating the array substrate comprises, for example, the following steps.

Figure 2A:
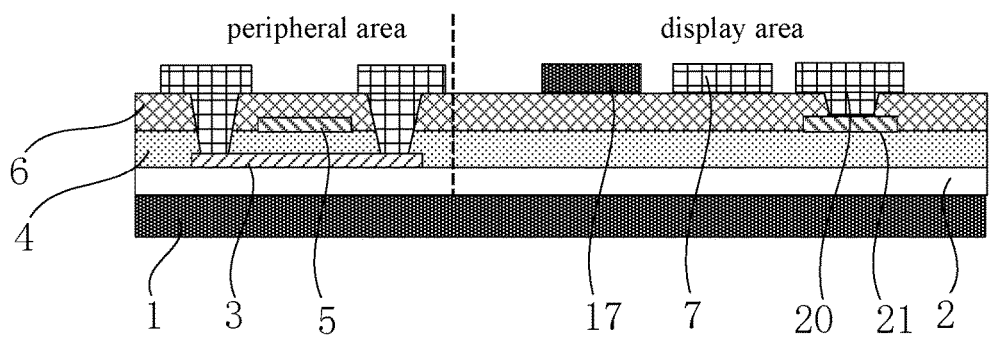
FIGS. 2a to 2e are structural schematic diagrams after performing each step of the method for fabricating an array substrate provided by the embodiments of this disclosure, respectively.
Figure 4A:
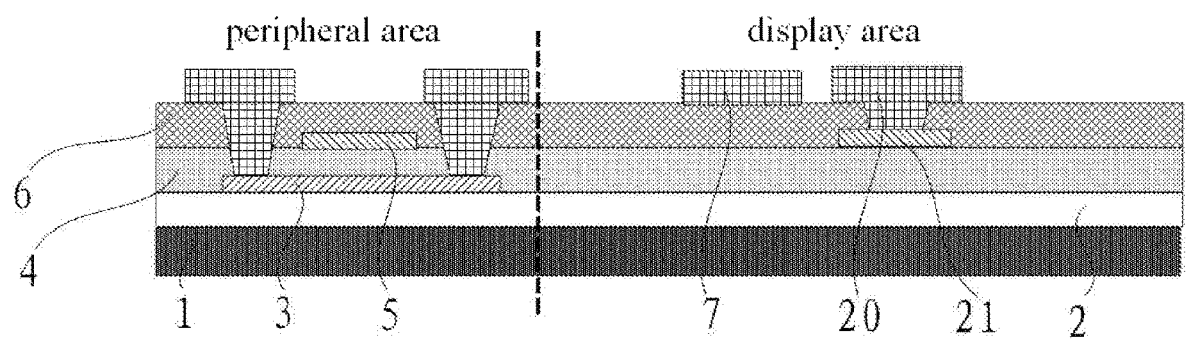
FIGS. 4a to 4f are structural schematic diagrams after performing each step of the method for fabricating an array substrate provided by the embodiments of this disclosure, respectively.

At step S101, as shown by FIG. 2a and FIG. 4a, an active layer 3 of a low temperature polysilicon TFT is formed in a peripheral area of the array substrate, a gate 5 of the low temperature polysilicon TFT is formed above the active layer 3 of the low temperature polysilicon TFT, and a source and a drain of the low temperature polysilicon TFT electrically connected to the active layer 3 of the low temperature polysilicon TFT are formed.

At step S102, as shown by FIGS. 2b to 2c and FIGS. 4b to 4c, while forming the source and the drain of the low temperature polysilicon TFT electrically connected to the active layer of the low temperature polysilicon TFT, a gate 20 of an oxide TFT disposed in the same layer as the source and the drain of the low temperature polysilicon TFT is formed in a display area of the array substrate, and an active layer 11 of the oxide TFT electrically insulated from the gate 20 of the oxide TFT is formed above the gate 20 of the oxide TFT.

Figure 2B:
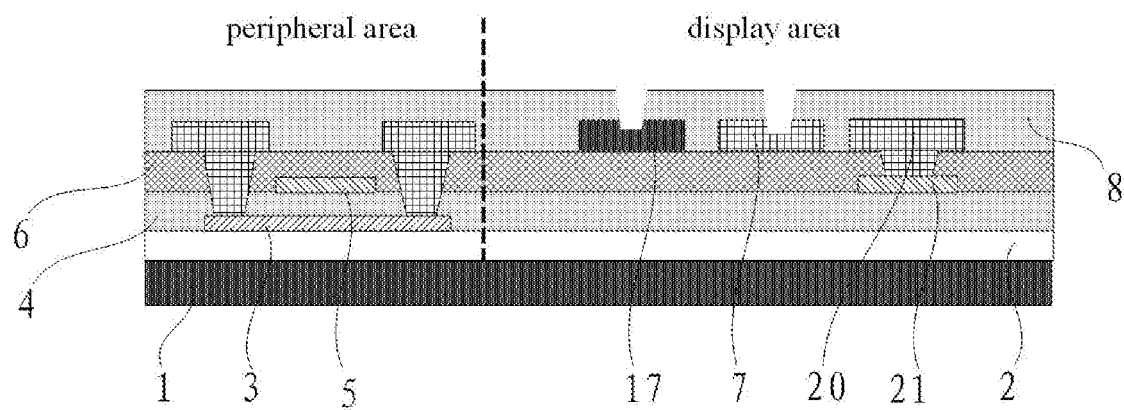
Figure 2C:
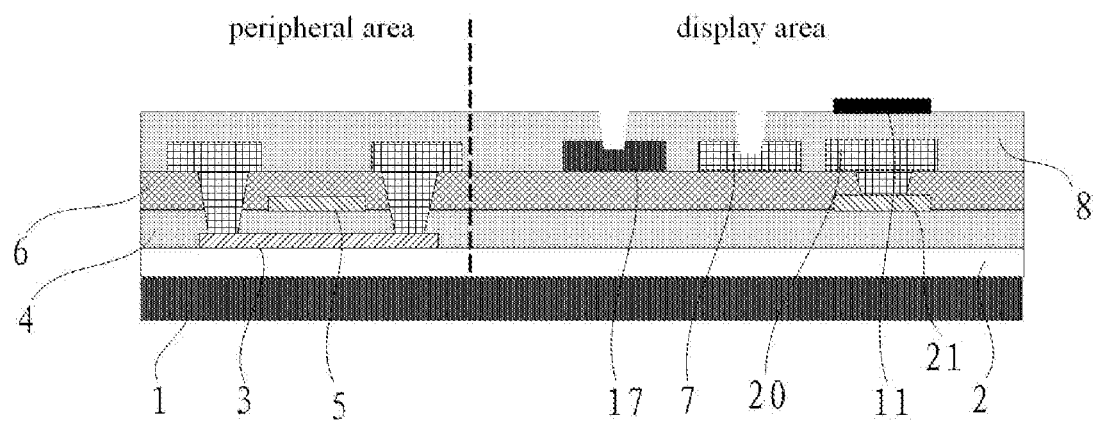
Figure 2D:
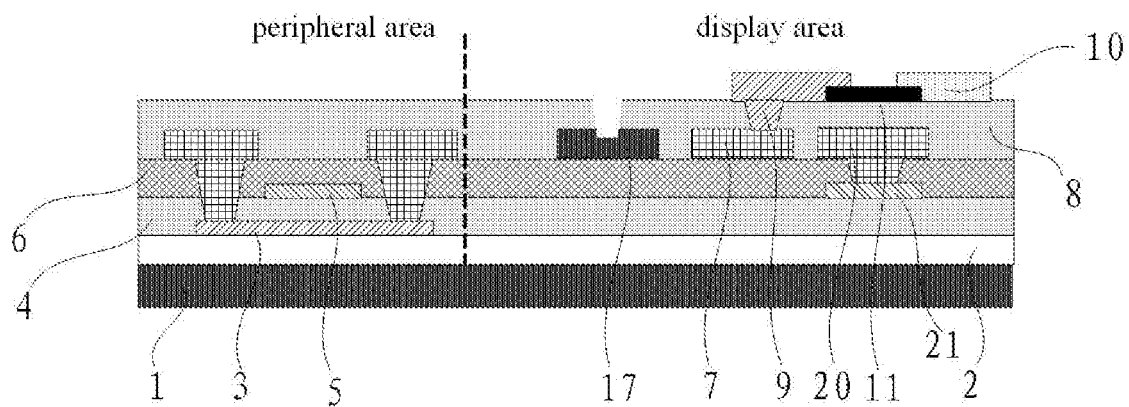
Figure 4B:
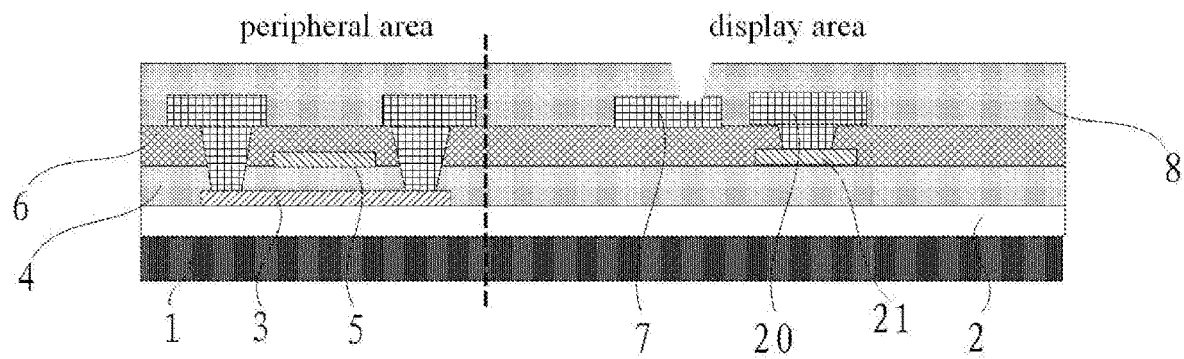
Figure 4C:
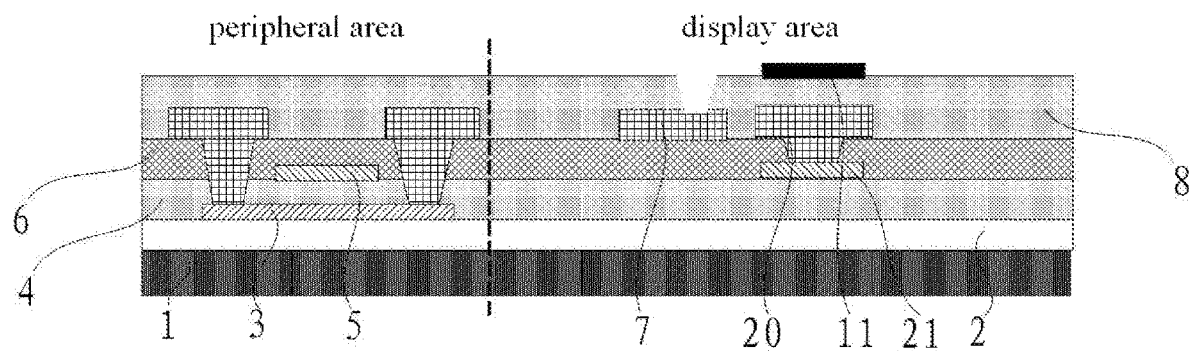
Figure 4D:
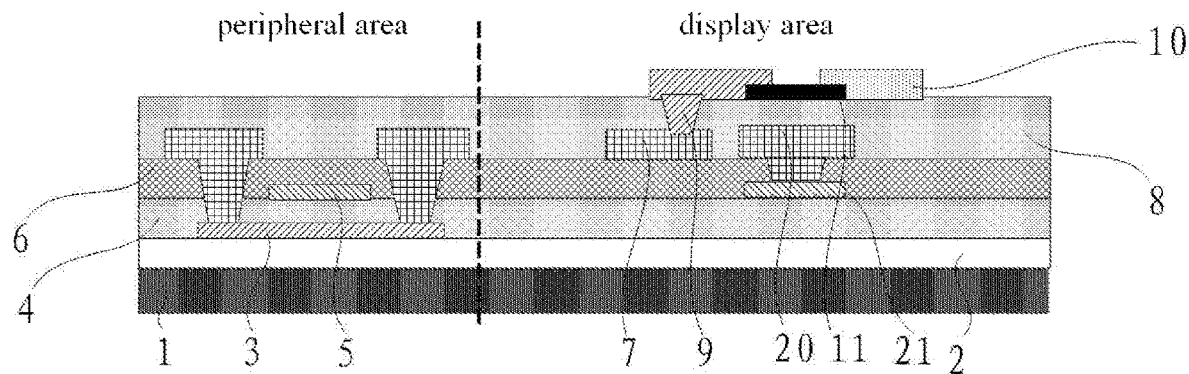
Figure 4E:
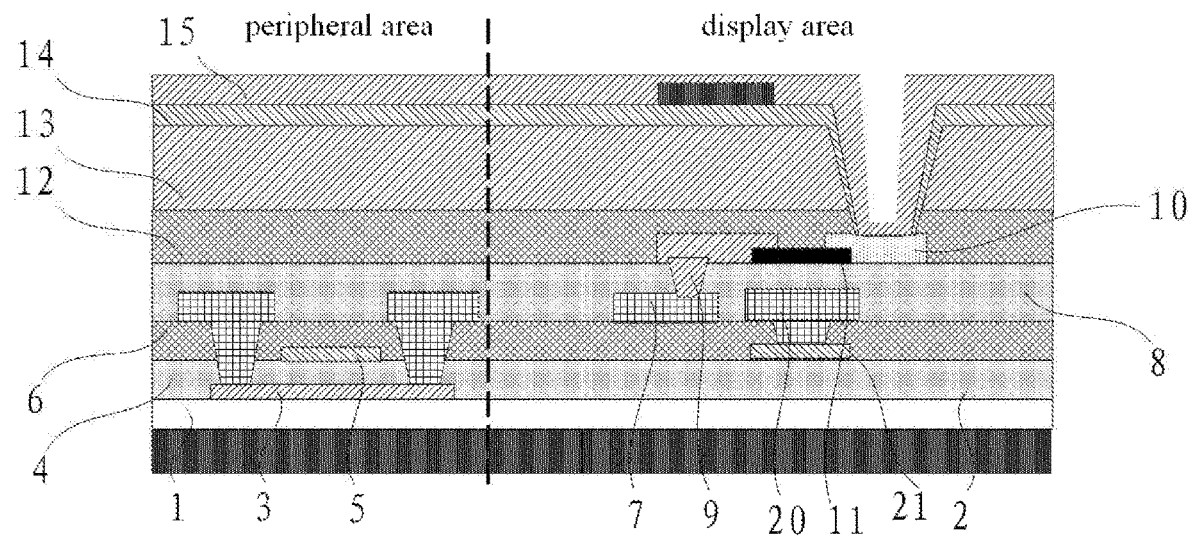

At step S103, as shown by FIG. 2d and FIG. 4d, a source 9 of the oxide TFT and a drain 10 of the oxide TFT is formed on the active layer 11 of the oxide TFT by using wet etching.

In the above-described method for fabricating the array substrate, the erosion of the active layer 11 of the oxide TFT caused while forming the source 9 of the oxide TFT and the drain 10 of the oxide TFT is avoided by separating source and drain metal layers into the source and the drain of the low temperature polysilicon TFT, and the source 9 of the oxide TFT and the drain 10 of the oxide TFT disposed in the same layer as the active layer 11 of the oxide TFT, and forming the source 9 of the oxide TFT and the drain 10 of the oxide TFT by using wet etching, thus increasing a product yield of the array substrate.

In an example, according to the step S101, the active layer 3 of the low temperature polysilicon TFT is formed in the peripheral area, the gate 5 of the low temperature polysilicon TFT is formed above the active layer 3 of the low temperature polysilicon TFT, and the source and the drain of the low temperature polysilicon TFT electrically connected to the active layer 3 of the low temperature polysilicon TFT are formed by using dry etching, wherein a data wiring for the gate 5 of the low temperature polysilicon TFT has an accurate width.

In an example, according to the step S102, while forming the source and the drain of the low temperature polysilicon TFT electrically connected to the active layer of the low temperature polysilicon TFT, the gate 20 of the oxide TFT disposed in the same layer as the source and the drain of the low temperature polysilicon TFT is formed in the display area, and the active layer 11 of the oxide TFT electrically insulated from the gate 20 of the oxide TFT is formed above the gate 20 of the oxide TFT.

According to the step S103, the source 9 of the oxide TFT and the drain 10 of the oxide TFT are formed on the active layer 11 of the oxide TFT by using wet etching. The source and the drain of the low temperature polysilicon TFT, and the source 9 of the oxide TFT and the drain 10 of the oxide TFT, are fabricated through different steps. That is, the source and drain metal layers are separated by using different fabrication methods, meanwhile the source 9 of the oxide TFT and the drain 10 of the oxide TFT disposed in the same layer as the active layer 11 of the oxide TFT are fabricated by using wet etching, thereby preventing the active layer 11 of the oxide TFT from being eroded when etching the source and drain of the lower temperature polysilicon TFT.

In an example, the method for fabricating the array substrate further comprises: forming a source wiring 7 of the oxide TFT disposed in the same layer as the source and the drain of the low temperature polysilicon TFT in the display area, wherein the source wiring 7 of the oxide TFT is electrically connected to the source 9 of the oxide TFT through a via.

Disposing the source 9 of the oxide TFT and the drain 10 of the oxide TFT and the active layer 11 of the oxide TFT in a same layer and only in the display area, and electrically connecting the source 9 of the oxide TFT with the source wiring 7 of the oxide TFT positioned therebelow, can accurately control pixel openings of the array substrate and increase an etching uniformity and an etching accuracy for fabricating with wet etching.

Therefore, the above-described method for fabricating the array substrate can reduce the damage to the active layer 11 of the oxide TFT and increase the product yield.

In an example, the method for fabricating the array substrate further comprises: while forming the gate 5 of the low temperature polysilicon TFT above the active layer 3 of the low temperature polysilicon TFT, forming a gate wiring 21 of the oxide TFT disposed in the same layer as the gate 5 of the low temperature polysilicon TFT in the display area, wherein the gate wiring 21 of the oxide TFT is connected to the gate 20 of the oxide TFT through a via in an interlayer dielectric layer 6.

In an example, as shown by FIG. 2a and FIG. 4a, forming the gate 5 of the low temperature polysilicon TFT above the active layer 3 of the low temperature polysilicon TFT and forming the source and the drain of the low temperature polysilicon TFT electrically connected to the active layer 3 of the low temperature polysilicon TFT comprises: forming a first insulation layer 4 on the active layer 3 of the low temperature polysilicon TFT, forming a gate metal layer on the first insulation layer 4, and patterning the gate metal layer in the peripheral area to form the gate 5 of the low temperature polysilicon TFT; forming an interlayer dielectric layer 6 on the gate metal layer, forming a first metal layer on the interlayer dielectric layer 6, and patterning the first metal layer in the peripheral area to form the source and the drain of the low temperature polysilicon TFT; wherein the source and the drain of the low temperature polysilicon TFT are connected to the active layer 3 of the low temperature polysilicon TFT through vias.

In the above-described method for fabricating the array substrate, dry etching is used to fabricate the source and the drain of the low temperature polysilicon TFT. First, a buffer layer 2 is formed on the entire area of a base substrate 1; next, the active layer 3 of the low temperature polysilicon TFT is formed in the peripheral area, wherein the active layer 3 of the low temperature polysilicon TFT comprises a polysilicon material; subsequently, the first insulation layer 4 and the gate metal layer are fabricated on the entire area in this order and the gate metal layer is patterned, the patterned gate metal layer in the peripheral area forms the gate 5 of the low temperature polysilicon TFT; then, the interlayer dielectric layer 6 and the first metal layer are fabricated on the entire area in this order and the first metal layer is patterned, the patterned first metal layer in the peripheral area forming the source and the drain of the low temperature polysilicon TFT, wherein the source and the drain of the low temperature polysilicon TFT are connected to the active layer 3 of the low temperature polysilicon TFT through vias. The source and the drain of the low temperature polysilicon TFT can be conveniently and quickly fabricated through the above-described method.

In an example, as shown by FIG. 2b and FIG. 4b, forming the gate wiring 21 of the oxide TFT disposed in the same layer as the gate of the low temperature polysilicon TFT in the display area comprises: while forming the gate 5 of the low temperature polysilicon TFT above the active layer 3 of the low temperature polysilicon TFT, patterning the gate metal layer in the display area to form the gate wiring 21 of the oxide TFT.

In an example, as shown by FIG. 2b and FIG. 4b, forming the source wiring 7 disposed in the same layer as the source and the drain of the low temperature polysilicon TFT in the display area comprises: patterning the first metal layer in the display area to form the source wiring 7 of the oxide TFT; and while patterning the first metal layer, forming the source wiring 7 of the oxide TFT and the source and the drain of the low temperature polysilicon TFT using a same patterning process.

In an example, as shown by FIG. 2b and FIG. 4b, forming the gate 20 of the oxide TFT disposed in the same layer as the source and the drain of the low temperature polysilicon TFT in the display area comprises: while patterning the first metal layer, forming the source wiring 7 of the oxide TFT, the source and the drain of the low temperature polysilicon TFT, and the gate 20 of the oxide TFT using a same patterning process.

In the above-described method for fabricating the array substrate, the patterned first metal layer in the display area forms the source wiring 7 of the oxide TFT and the gate 20 of the oxide TFT, wherein the source wiring 7 of the oxide TFT and the gate 20 of the oxide TFT comprise a metal material. The patterned gate metal layer in the display area forms the gate wiring 21 of the oxide TFT below the gate 20 of the oxide TFT, and the gate wiring 21 of the oxide TFT and the gate 20 of the oxide TFT are connected through the via in the interlayer dielectric layer 6. The gate 20 of the oxide TFT can be conveniently and quickly fabricated through the above-described method.

In an example, forming the active layer 11 of the oxide TFT electrically insulated from the gate of the oxide TFT comprises: as shown by FIG. 2c and FIG. 4c, forming a second insulation layer 8 on the gate 20 of the oxide TFT, and depositing the active layer 11 of the oxide TFT on the second insulation layer 8 in the display area, wherein the material for the active layer 11 of the oxide TFT may be a metal oxide or a metal oxynitride. In an example, the active layer 11 of the oxide TFT may be deposited, for example, by using plasma enhanced chemical vapor. However, those skilled in the art may use other methods to deposit the active layer 11 of the oxide TFT, which is not limited in the present disclosure.

In an example, forming the source 9 of the oxide TFT and the drain 10 of the oxide TFT on the active layer 11 of the oxide TFT by using wet etching comprises: as shown by FIG. 2D and FIG. 4d, forming a second metal layer on the second insulation layer 8 in the display area, patterning the second metal layer by using wet etching to form the source 9 of the oxide TFT and the drain 10 of the oxide TFT, wherein the source 9 of the oxide TFT and the drain 10 of the oxide TFT cover the ends of the active layer 11 of the oxide TFT, and wherein the source 9 of the oxide TFT is connected to the source wiring 7 of the oxide TFT through a via.

In the above-described method for fabricating the array substrate, in order to form the source 9 of the oxide TFT, the drain 10 of the oxide TFT, and the active layer 11 of the oxide TFT disposed in the same layer, the following steps are adopted. First, the active layer 11 of the oxide TFT is deposited on the second insulation layer 8 in the display area by using plasma enhanced chemical vapor deposition or other methods that can fulfill the function, wherein the material for the active layer 11 of the oxide TFT may be a metal oxide or a metal oxynitride, or may be a composite of metal oxides and metal oxynitrides, or may also be other material that can fulfill the function. Next, the source 9 of the oxide TFT and the drain 10 of the oxide TFT are fabricated on the second insulation layer 8 in the display area by using wet etching, wherein the source 9 of the oxide TFT and the drain 10 of the oxide TFT cover the ends of the active layer 11 of the oxide TFT. As the source 9 of the oxide TFT and the drain 10 of the oxide TFT are fabricated by using wet etching, the erosion of the active layer 11 of the oxide TFT can be avoided. Moreover, as the source 9 of the oxide TFT is connected to the source wiring 7 of the oxide TFT through a via in the second insulation layer 8 positioned therebelow, the pixel openings of the array substrate can be accurately controlled, the etching uniformity and the etching accuracy can be increased, and the product yield can be increased.

In an example, the method for fabricating the array substrate further comprises forming a first protection layer 12, a first planarization layer 13, a common electrode 18 of the oxide TFT, a second protection layer 16, and a pixel electrode 19 of the oxide TFT on the source 9 of the oxide TFT and the drain 10 of the oxide TFT in this order, wherein the pixel electrode 19 of the oxide TFT is electrically connected to the drain 10.

In the above-described method for fabricating the array substrate, compared to the conventional 9-mask fabrication process, masks required for forming light shielding layers are reduced, masks required for forming the second insulation layer 8, the active layer 11 of the oxide TFT, the source 9 of the oxide TFT, the drain 10 of the oxide TFT, and the second protection layer 16 are added, which can simply and quickly fabricate the array substrate.

On the basis of the above-described method for fabricating the array substrate, a touch wiring 17 of the oxide TFT is required to be added in the array substrate in order to achieve the touch function.

Figure 3:
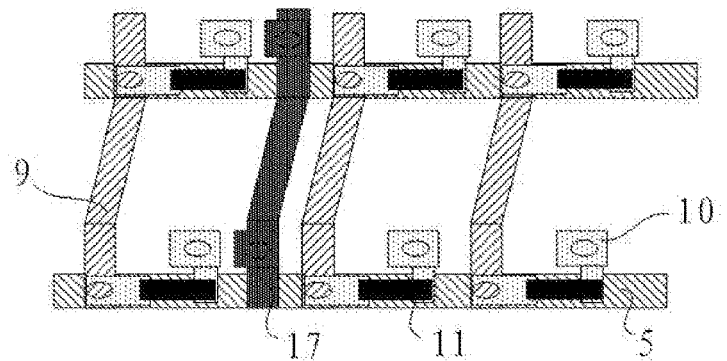
FIG. 3 is a structural schematic diagram of the array substrate of FIG. 2e.

In an example, as shown by FIG. 2a and FIG. 3, after forming the first metal layer and before forming the second insulation layer 8, a touch wiring 17 of the oxide TFT is formed on the interlayer dielectric layer 6 in the display area.

In the above-described method for fabricating the array substrate, the touch wiring 17 of the oxide TFT is disposed on the interlayer dielectric layer 6, a same mask may be used to form the source wiring 7 of the oxide TFT on the interlayer dielectric layer 6 and to form the touch wiring 17 of the oxide TFT in the display area during fabricating.

Figure 2E:
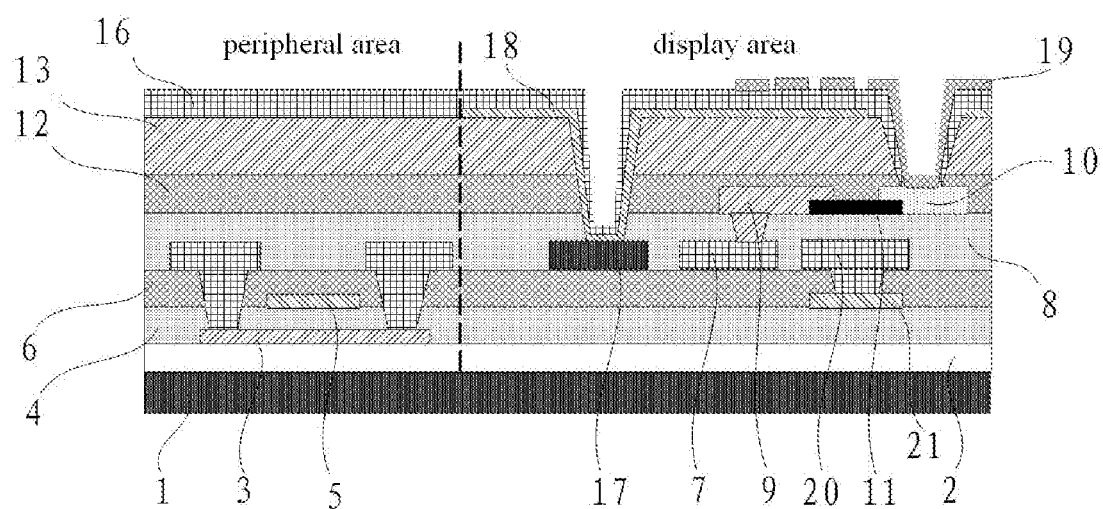

In an example, as shown by FIG. 2e, after forming the first planarization layer 13 and before forming the second protection layer 16, a common electrode 18 of the oxide TFT is formed on the interlayer dielectric layer 6 in the display area, wherein the common electrode 18 of the oxide TFT is electrically connected to a touch wiring 17 of the oxide TFT.

In an example, as shown by FIG. 4c, FIG. 4d, FIG. 4e, FIG. 4f, and FIG. 5, after forming the first planarization layer 13 and before forming the second protection layer 16, a third protection layer 14, the touch wiring 17 of the oxide TFT, a second planarization layer 15, and a common electrode 18 of the oxide TFT on the first planarization layer 13 are formed in the peripheral area in this order, wherein the common electrode 18 of the oxide TFT is electrically connected to the touch wiring 17 of the oxide TFT.

In the above-described method for fabricating the array substrate, the touch wiring 17 of the oxide TFT is disposed between the third protection layer 14 and the second planarization layer 15. During fabricating, the first metal layer and the touch wiring 17 of the oxide TFT using two masks, thus it is not need to consider the process limit of same layer metal etching condition, the case in which the process cannot work well due to very small interval will not be present. Meanwhile, making the touch wiring 17 of the oxide TFT be in a region of the source 9 of the oxide TFT shielded by a black matrix as much as possible, the opening area occupied by the touch wiring 17 of the oxide TFT being relatively small, can largely increase the product's aperture ratio.

Furthermore, this disclosure further provides an array substrate comprising at least one low temperature polysilicon TFT in a peripheral area and at least one oxide TFT in a display area.

The low temperature polysilicon TFT comprises an active layer 3 of the low temperature polysilicon TFT, a gate 5 of the low temperature polysilicon TFT formed above the active layer 3 of the low temperature polysilicon TFT, and a source and a drain of the low temperature polysilicon TFT electrically connected to the active layer 3 of the low temperature polysilicon TFT.

The oxide TFT comprises a gate 20 of the oxide TFT disposed in the same layer as the source and the drain of the low temperature polysilicon TFT, and an active layer 11 of the oxide TFT located on the gate 20 of the oxide TFT and electrically insulated from the gate 20 of the oxide TFT, and a source 9 of the oxide TFT and a drain 10 of the oxide TFT formed on the active layer 11 of the oxide TFT by using wet etching.

In the above-described array substrate, as the source 9 of the oxide TFT and the drain 10 of the oxide TFT are fabricated by using wet etching, the erosion of the active layer 11 of the oxide TFT when forming the source 9 of the oxide TFT and the drain 10 of the oxide TFT is avoided, such that the product yield of the active layer 11 of the oxide TFT is relatively high.

In an example, the array substrate further comprises a source wiring 7 of the oxide TFT, wherein the source wiring 7 of the oxide TFT is electrically connected to the source 9 of the oxide TFT through a via.

Disposing the source 9 of the oxide TFT and the drain 10 of the oxide TFT and the active layer 11 of the oxide TFT in a same layer and only in the display area, and electrically connecting the source 9 of the oxide TFT with the source wiring 7 of the oxide TFT positioned therebelow, can accurately control pixel openings of the array substrate and increase an etching uniformity and an etching accuracy for fabricating with wet etching, such that the array substrate has relatively accurate pixel openings, better accuracy, and higher product yield.

In an example, the array substrate further comprises a gate wiring 21 of the oxide TFT, the gate wiring 21 of the oxide TFT being electrically connected to the gate 20 of the oxide TFT through a via.

Figure 4F:
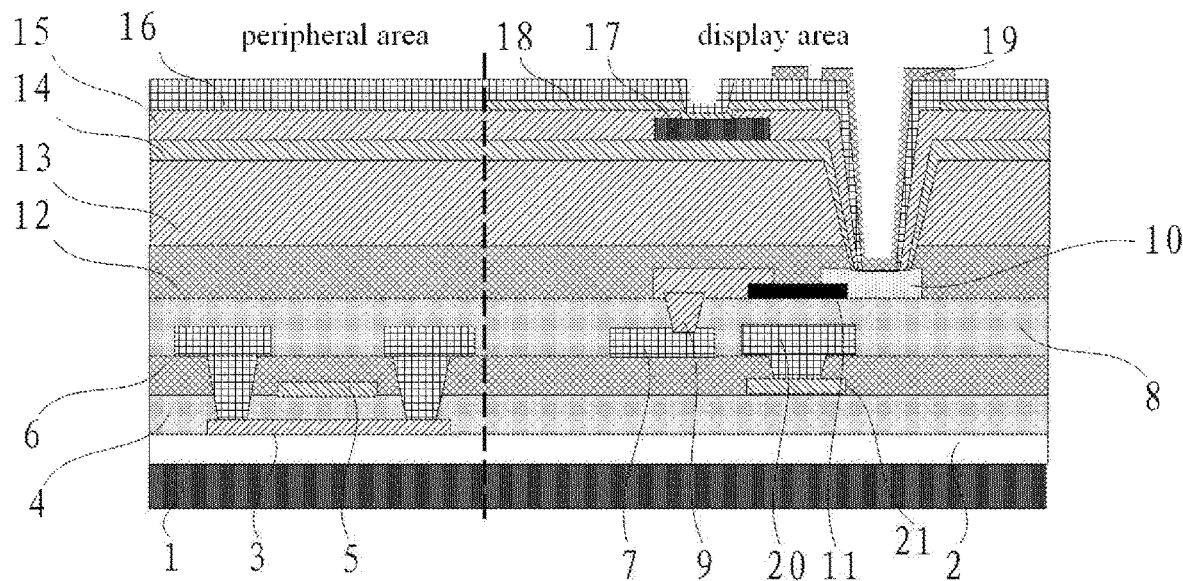
Figure 5:
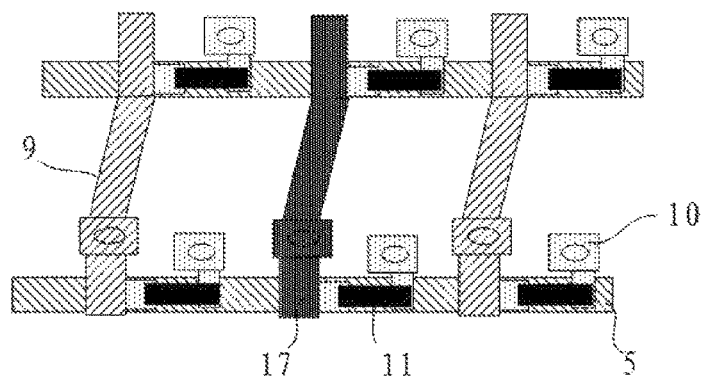
FIG. 5 is a structural schematic diagram of the array substrate of FIG. 4f.

As shown by FIG. 2e and FIG. 4f, in an example, the active layer 3 of the low temperature polysilicon TFT comprises a polysilicon, the active layer 11 of the oxide TFT comprises a metal oxide or a metal oxynitride.

In the above-described array substrate, the active layer 11 of the oxide TFT comprising a metal oxide or a metal oxynitride can generally lead to a relatively small leakage current of the oxide TFT, which enables a reduced pixel refresh rate and thus a lower power consumption and an increased product yield.

In an example, as shown by FIG. 2e, the array substrate further comprises a first protection layer 12, a first planarization layer 13, a common electrode 18 of the oxide TFT, a second protection layer 16, and a pixel electrode 19 of the oxide TFT in the display area formed above the source 9 and the drain 10 of the oxide TFT in this order, wherein the pixel electrode 19 is electrically connected to the drain 10 of the oxide TFT.

In an example, as shown by FIG. 2e, the array substrate further comprises a touch wiring 17 of the oxide TFT in the display area, the touch wiring 17 of the oxide TFT being electrically connected to the common electrode 18 of the oxide TFT.

In an example, as shown by FIG. 4f, the array substrate further comprises a first protection layer 12, a first planarization layer 13, a third protection layer 14, a touch wiring 17 of the oxide TFT, a second planarization layer 15, a common electrode 18 of the oxide TFT, a second protection layer 16, and a pixel electrode 19 of the oxide TFT in the display area formed above the source 9 and the drain 10 of the oxide TFT in this order, wherein the common electrode 18 of the oxide TFT is electrically connected to the touch wiring 17 of the oxide TFT, and wherein the pixel electrode 19 is electrically connected to the drain 10 of the oxide TFT.

Furthermore, this disclosure further provides a display apparatus comprising the array substrate of any of the above-described technical solutions. As the array substrate has relatively accurate pixel openings, better accuracy, and higher product yield, the display apparatus with the array substrate has a relatively high product yield.

Those skilled in the art can make various modifications and variations to this disclosure without departing from the spirit and the scope of this disclosure. As such, if these modifications and variations of this disclosure fall into the scope of this disclosure's claims and its equivalent technologies, this disclosure is intended to include these modifications and variations.

What is claimed is:

1. A method for fabricating an array substrate comprising a display area and a peripheral area around the display area, the method comprising:
    forming an active layer of a low temperature polysilicon thin film transistor (TFT) in the peripheral area, forming a gate of the low temperature polysilicon TFT above the active layer of the low temperature polysilicon TFT, and forming a source and a drain of the low temperature polysilicon TFT electrically connected to the active layer of the low temperature polysilicon TFT;
    forming a gate of an oxide TFT disposed in the same layer as the source and the drain of the low temperature polysilicon TFT in the display area, and forming an active layer of the oxide TFT electrically insulated from the gate of the oxide TFT above the gate of the oxide TFT;
    forming a source and a drain of the oxide TFT on the active layer of the oxide TFT by using wet etching.

2. The method for fabricating the array substrate according to claim 1, wherein forming the gate of the low temperature polysilicon TFT above the active layer of the low temperature polysilicon TFT, and forming the source and the drain of the low temperature polysilicon TFT electrically connected to the active layer of the low temperature polysilicon TFT comprises:
    forming a first insulation layer on the active layer of the low temperature polysilicon TFT, forming a gate metal layer on the first insulation layer, and patterning the gate metal layer in the peripheral area to form the gate of the low temperature polysilicon TFT;
    forming an interlayer dielectric layer on the gate metal layer, forming a first metal layer on the interlayer dielectric layer, and patterning the first metal layer in the peripheral area to form the source and the drain of the low temperature polysilicon TFT;

wherein the source and the drain of the low temperature polysilicon TFT are electrically connected to the active layer of the low temperature polysilicon TFT through vias.

3. The method for fabricating the array substrate according to claim 2, further comprising:

while forming the source and the drain of the low temperature polysilicon TFT electrically connected to the active layer of the low temperature polysilicon TFT, forming a source wiring of the oxide TFT disposed in the same layer as the source and the drain of the low temperature polysilicon TFT in the display area, the source wiring of the oxide TFT being electrically connected to the source of the oxide TFT positioned above the source wiring through a via.

4. The method for fabricating the array substrate according to claim 3, further comprising:

while forming the gate of the low temperature polysilicon TFT above the active layer of the low temperature polysilicon TFT, forming a gate wiring of the oxide TFT disposed in the same layer as the gate of the low temperature polysilicon TFT in the display area, wherein the gate wiring of the oxide TFT is connected to the gate of the oxide TFT through a via in the interlayer dielectric layer.

5. The method for fabricating the array substrate according to claim 3, wherein forming the source wiring of the oxide TFT disposed in the same layer as the source and the drain of the low temperature polysilicon TFT in the display area comprises:

patterning the first metal layer in the display area to form the source wiring of the oxide TFT;

while patterning the first metal layer, forming the source wiring of the oxide TFT and the source and the drain of the low temperature polysilicon TFT using a single patterning process.

6. The method for fabricating the array substrate according to claim 4, wherein forming the gate of the oxide TFT disposed in the same layer as the source and the drain of the low temperature polysilicon TFT in the display area comprises:

while patterning the first metal layer, forming the source wiring of the oxide TFT, the source and the drain of the low temperature polysilicon TFT, and the gate of the oxide TFT using a same patterning process.

7. The method for fabricating the array substrate according to claim 3, wherein forming the active layer of the oxide TFT electrically insulated from the gate of the oxide TFT above the gate of the oxide TFT comprises:

forming a second insulation layer on the source wiring of the oxide TFT and the gate of the oxide TFT and depositing the active layer of the oxide TFT on the second insulation layer in the display area, wherein a material of the active layer of the oxide TFT comprises a metal oxide or a metal oxynitride.

8. The method for fabricating the array substrate according to claim 7, wherein forming the source and the drain of the oxide TFT on the active layer of the oxide TFT by using wet etching comprises:

forming a second metal layer on the second insulation layer in the display area, patterning the second metal layer by using wet etching to form the source and the drain of the oxide TFT, wherein the source and the drain of the oxide TFT cover ends of the active layer of the oxide TFT, and wherein the source of the oxide TFT is connected to the source wiring of the oxide TFT through a via in the second insulation layer.

9. The method for fabricating the array substrate according to claim 8, further comprising:

forming a first protection layer, a first planarization layer, a common electrode of the oxide TFT, a second protection layer, and a pixel electrode of the oxide TFT on the source and the drain of the oxide TFT in this order, wherein the pixel electrode is electrically connected to the drain of the oxide TFT.

10. The method for fabricating the array substrate according to claim 9, the method further comprising:

after forming the first metal layer and before forming the second insulation layer, forming a touch wiring of the oxide TFT on the interlayer dielectric layer in the display area, wherein the touch wiring of the oxide TFT is electrically connected to the common electrode of the oxide TFT.

11. The method for fabricating the array substrate according to claim 9, the method further comprising:

after forming the first planarization layer and before forming the second protection layer, forming a third protection layer, a touch wiring of the oxide TFT, and a second planarization layer on the first planarization layer in the display area in this order, wherein the touch wiring of the oxide TFT is electrically connected to the common electrode.

12. An array substrate, comprising:

at least one low temperature polysilicon thin film transistor (TFT) in a peripheral area of the array substrate, the low temperature polysilicon TFT comprising:

an active layer of the low temperature polysilicon TFT, a gate of the low temperature polysilicon TFT formed above the active layer of the low temperature polysilicon TFT, and a source and a drain of the low temperature polysilicon TFT electrically connected to the active layer of the low temperature polysilicon TFT; and at least one oxide TFT in a display area of the array substrate, the oxide TFT comprising:

a gate of the oxide TFT disposed in the same layer as the source and the drain of the low temperature polysilicon TFT, an active layer of the oxide TFT electrically insulated from and above the gate of the oxide TFT, and a source and a drain of the oxide TFT formed on the active layer of the oxide TFT by using wet etching.

13. The array substrate according to claim 12, further comprising a source wiring of the oxide TFT, wherein the source wiring of the oxide TFT is electrically connected to the source of the oxide TFT through a via.

14. The array substrate according to claim 12, further comprising a gate wiring of the oxide TFT, wherein the gate wiring of the oxide TFT is electrically connected to the gate of the oxide TFT through a via.

15. The array substrate according to claim 12, further comprising a first protection layer, a first planarization layer, a common electrode of the oxide TFT, a second protection layer, and a pixel electrode of the oxide TFT in the display area formed above the source and the drain of the oxide TFT in this order, wherein the pixel electrode is electrically connected to the drain of the oxide TFT.

16. The array substrate according to claim 15, further comprising a touch wiring of the oxide TFT in the display area, wherein the touch wiring of the oxide TFT is electrically connected to the common electrode of the oxide TFT.

17. The array substrate according to claim 12, further comprising a first protection layer, a first planarization layer, a third protection layer, a touch wiring of the oxide TFT, a second planarization, a common electrode of the oxide TFT, a second protection layer, and a pixel electrode of the oxide TFT in the display area formed above the source and the drain of the oxide TFT in this order, wherein the common electrode of the oxide TFT is electrically connected to the touch wiring of the oxide TFT, and wherein the pixel electrode is electrically connected to the drain of the oxide TFT.

18. The array substrate according to claim 12, wherein the active layer of the low temperature polysilicon TFT comprises a polysilicon, and wherein the active layer of the oxide TFT comprises a metal oxide or a metal oxynitride.

19. A display apparatus comprising the array substrate according to claim 12.

20. The display apparatus according to claim 19, wherein the active layer of the low temperature polysilicon TFT comprises a polysilicon, and wherein the active layer of the oxide TFT comprises a metal oxide or a metal oxynitride.

\* \* \* \* \*